United States Patent

Tada

(10) Patent No.: US 6,456,831 B1
(45) Date of Patent: Sep. 24, 2002

(54) AMPLITUDE CHANGE TIME ACTIVATED PHASE LOCKED CONTROLLER IN A SELECTIVE CALL RECEIVER

(75) Inventor: Ken-ichi Tada, Shizuoka (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/277,371

(22) Filed: Mar. 29, 1999

(30) Foreign Application Priority Data

Mar. 30, 1998 (JP) .......................................... 10-083117

(51) Int. Cl.$^7$ ................................................ H04B 1/18
(52) U.S. Cl. .................................... 455/180.3; 455/260
(58) Field of Search .............................. 455/31.1, 260, 455/426, 31.2, 226.2, 180.3, 257, 258, 559, 184.1; 340/825.44, 7.2, 825.36; 331/15; 375/344, 376

(56) References Cited

U.S. PATENT DOCUMENTS

| | | | |
|---|---|---|---|
| 3,976,943 A | * 8/1976 | Cipher et al. | ................ 455/144 |
| 4,535,306 A | * 8/1985 | Yamaguchi et al. | .......... 331/23 |
| 4,651,105 A | * 3/1987 | Inbar | ........................... 327/73 |
| 4,852,090 A | * 7/1989 | Borth | ......................... 370/347 |
| 4,939,750 A | * 7/1990 | Nakamura | .................. 375/317 |
| 5,566,213 A | * 10/1996 | Carsello | ..................... 375/344 |
| 5,577,080 A | * 11/1996 | Sakaue et al. | ............. 375/376 |
| 5,703,914 A | * 12/1997 | Nakamura | .................. 375/355 |
| 6,005,507 A | * 12/1999 | Nakatsu et al. | ............. 341/155 |

FOREIGN PATENT DOCUMENTS

| | | |
|---|---|---|
| EP | 0 497 391 A1 | 8/1992 |
| JP | 5-176003 | 7/1993 |
| JP | 7-154434 | 6/1995 |
| JP | 8-237317 | 9/1996 |
| JP | 9-8854 | 1/1997 |
| JP | 9-219727 | 8/1997 |
| JP | Hei 10-4436 | 1/1998 |
| WO | WO 82/00742 | 3/1982 |

OTHER PUBLICATIONS

Japanese Office Action, dated Nov. 30, 1999, with English language translation of Japanese Examiner's comments.
English language translation of Japanese Office Action dated Feb. 10, 1999 (Hei 11).

* cited by examiner

*Primary Examiner*—Dwayne Bost
*Assistant Examiner*—Sonny Trinh
(74) *Attorney, Agent, or Firm*—Whitham, Curtis & Christofferson, PC

(57) ABSTRACT

A radio receiver with improved accuracy of phase-locked loop is disclosed. In addition to a detector for detecting a detected signal from a received radio signal, the receiver includes a monitor for monitoring an amplitude change of the detected signal to detect timing where the amplitude change occurs over a predetermined range. The phase-locked control of the timing clock signal with respect to the detected signal is performed only when the timing is detected by the monitor.

15 Claims, 5 Drawing Sheets

AMPLITUDE CHANGE TIME ACTIVATED PHASE LOCKED CONTROLLER IN A SELECTIVE CALL RECEIVER

BACKGROUND OF THE INVENTION

1. Field of the Invention

The present invention relates to a radio selective call receiver, and in particular to a phase-locked loop control method for the radio selective call receivers

2. Description of the Related Art

In conventional radio selective call receivers, the phase-locked loop control is performed for all change points using the output of a comparator having only one reference value.

For example, in a technique disclosed in Japanese Patent Laid-open No. 7-154434, an average value of a detected signal at the time of detection of a preamble signal is derived, and the code decision of the detected signal is made by using the average value of the detected signal as a reference level by means of digital signal processing.

Even if a variation is caused in the middle voltage of the detected signal due to a variation of the transmission frequency, a temperature change of the receiver, a supply voltage variation, and the like, errors of the code decision are reduced by the above described processing.

Furthermore in the above described technique, an ideal decision level is derived from the above described reference level, and the ideal decision level is used to obtain an error of the inputted detected signal. Correcting the error allows the reference level to follow the variation of the middle voltage of the detected signal.

In the conventional phase-locked loop control in the radio selective call receiver, the phase-locked loop control is performed for all change points using the output of a comparator having only one reference value. In systems using a binary FSK (Frequency Shift Keying) method, therefore, no problems occur. In systems using an M-ary (M>2) FSK method such as 4-ary FSK method, however, there occurs a problem that signal boundaries cannot be detected accurately, resulting in a reduced accuracy of phase control.

SUMMARY OF THE INVENTION

Therefore, an object of the present invention is to provide a radio selective call receiver capable of overcoming the above described problems, which can improve the accuracy of phase-locked loop control.

According to an aspect of the present invention, a radio receiver includes a detector for detecting a detected signal from a received radio signal; a monitor for monitoring an amplitude change of the detected signal to detect timing where the amplitude change occurs over a predetermined range: a clock generator for generating a timing clock signal; and a controller performing a phase-locked control of the timing clock signal only when the timing is detected by the monitor.

In other words, a phase-locked control or phase tracking control is performed using the timing or position of the detected signal exhibiting a high signal duty accuracy. Therefore, the receiving accuracy of a radio signal is improved.

According to another aspect of the present invention, a radio receiver for receiving a digital-modulated signal is comprised of a detector for detecting a detected signal from the digital-modulated signal, the detected signal having a plurality of signal levels and a comparator for comparing the detected signal to a plurality of reference levels to produce a plurality of comparison signals. Further, the receiver Is provided with a monitor for monitoring an amplitude change of the detected signal to detect a swing range of the detected signal and timing where the amplitude change occurs over the swing range; a selector for selecting one of the plurality of comparison signals. depending on the swing range detected by the monitor; and a controller performing a phase-locked control of a timing clock signal with respect to a selected comparison signal only when the timing is detected by the monitor.

Since one of a plurality of comparison signals is selected depending on the swing range detected by the monitor and is used for the phase-locked control. more accurate phase control is achieved, resulting in improved receiving performance.

DESCRIPTION OF THE PREFERRED EMBODIMENTS

Figure 1:
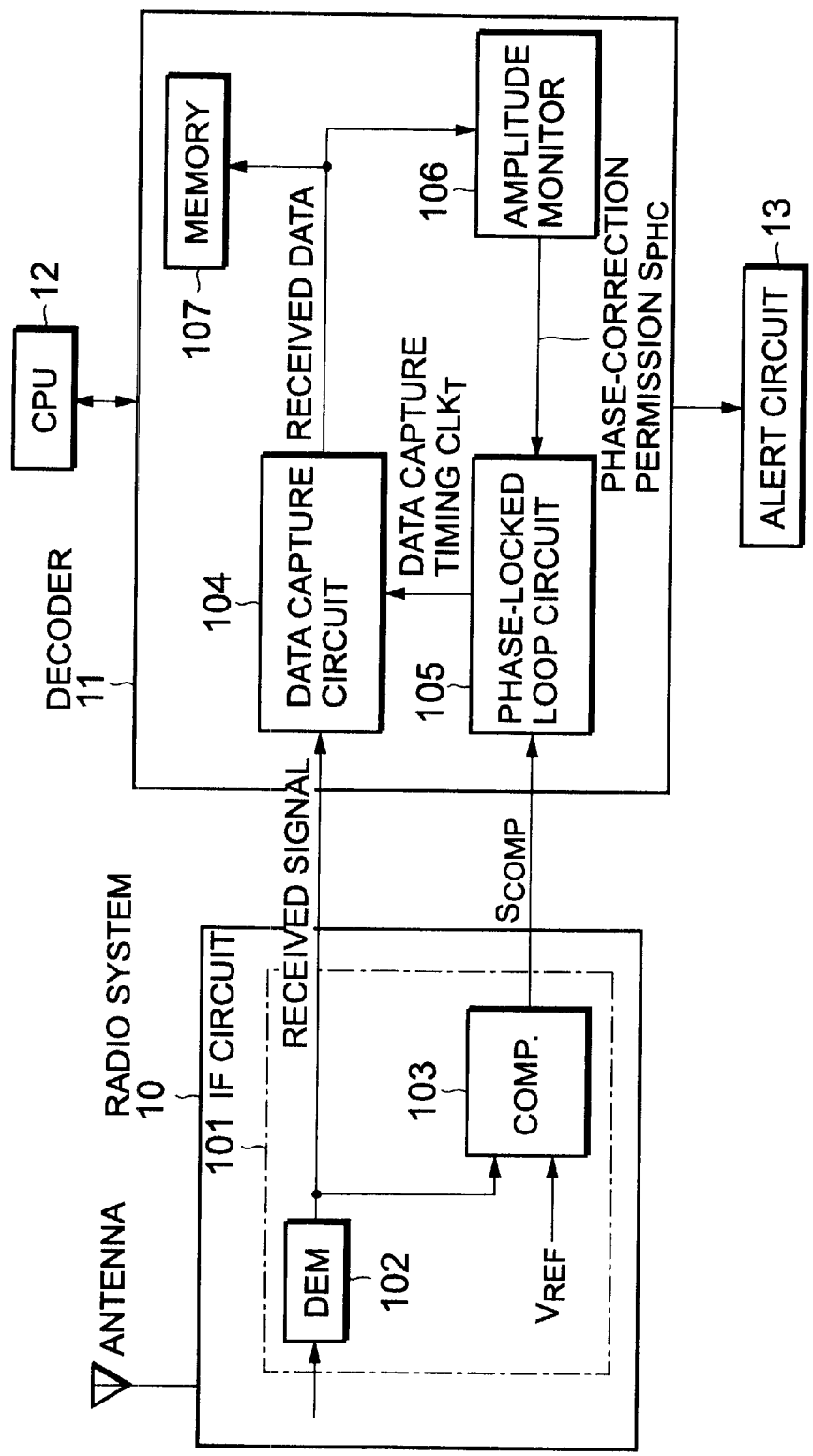
FIG. 1 is a block diagram showing the configuration of a radio selective call receiver according to a first embodiment of the present invention.

Referring to FIG. 1, a radio selective call receiver according to an embodiment of the present invention is mainly composed of a radio system 10 connected to an antenna and a decoder 11 which is connected to a processor (CPU) 12 and a alert circuit 13.

The radio system 10 includes an IF (Intermediate Frequency) circuit 101 which is composed of a demodulator 102 and a comparator 103. A radio signal such as a 4-ary FSK signal is inputted to the demodulator 102 of the IF circuit 101 and is demodulated into a baseband signal or a received signal.

More specifically, in the demodulator 102, the radio signal is converted from radio frequency to an intermediate frequency by a mixer (not shown), and the IF received signal is converted to a voltage signal (here, a received signal) by a discriminator (not shown). Further, the demodulator 102 is provided with a low-pass filter (not shown) which removes harmonic components from the voltage signal. Processing conducted in these circuits is a well-known technique, and consequently detailed description thereof will be omitted.

The comparator 103 inputs the voltage signal from the demodulator 102 and a reference voltage $V_{REF}$ and compares them to produce a comparison signal $S_{COMP}$. The reference voltage $V_{REF}$ is set to a middle voltage level of the amplitude of the received signal.

The decoder 11 includes a data capture circuit 104. a phase-locked loop circuit 105, an amplitude monitor 106, and a memory 107. The data capture circuit 104 captures the received signal inputted from the demodulator 102 depending on a data capture timing clock signal $CLK_T$. The captured signal is converted to a 2-bit digital signal consisting of MSB (Most Significant Bit) and LSB (Least Significant Bit) (hereinafter, called received-data). The data capture circuit 104 may be an analog-to-digital converter operating according to a sampling pulse.

The phase-locked loop circuit 105 produces the data capture timing clock signal $CLK_T$ according to the comparison signal $S_{COMP}$ and a phase-correction permission signal $S_{PRC}$ inputted from the amplitude monitor 106.

The amplitude monitor 106 inputs the received data from the data capture circuit 104 to monitor the amplitude of the received signal. The amplitude monitor 106 controls the phase-locked loop circuit 105 so as to activate the phase-locked loop circuit 105 only when the amplitude of the received signal is maximum, i.e., only when a 4-ary gray code changes from "00" to "10" or changes from "10" to "00".

Data captured by the data capture circuit 104 are sequentially stored in the memory 107. If a calling message addressed to the receiver itself is stored in the memory 107, the CPU 11 activates the alert circuit 13 to inform the user of an incoming call.

AMPLITUDE MONITOR

Figure 2:
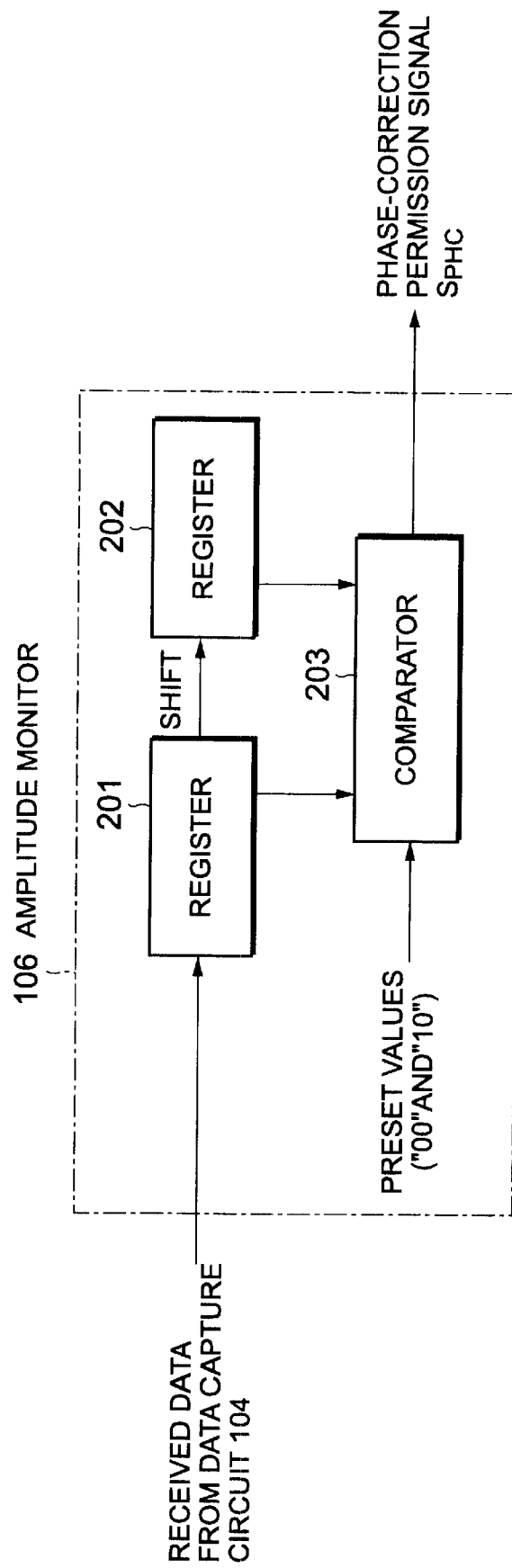
FIG. 2 is a block diagram showing a configuration example of an amplitude monitor of FIG. 1.

Referring to FIG. 2, the amplitude monitor 106 includes a first register 201, a second register 202, and a comparator 203. The first register 201 always preserves the latest data among the received data which were converted to 2-bit digital signal (cyclic binary: "00", "01", "11", "10") by the data capture circuit 104.

In conjunction with the first register 201, the second register 202 forms a shift register. Upon receiving new data, the first register 201 delivers old data to the second register 202.

The comparator 203 has a pair of preset values (here, "00" and "10") previously stored therein. The preset values ("00" and "10") represent a full swing of the received signal (see FIG. 4A), The comparator 203 receives data from both the first register 201 and the second register 202 to determine whether the data preserved in the first register 201 and the second register 202 is ("00" and "10") or ("10" and "00"). If so, the comparator 203 sets a flag (phase-correction permission). In other words, the amplitude monitor 106 determines whether the received signal swings over the full range between "00" and "10". The full swing provides a precise phase-locked control as described later.

PHASE-LOCKED LOOP CIRCUIT

Figure 3:
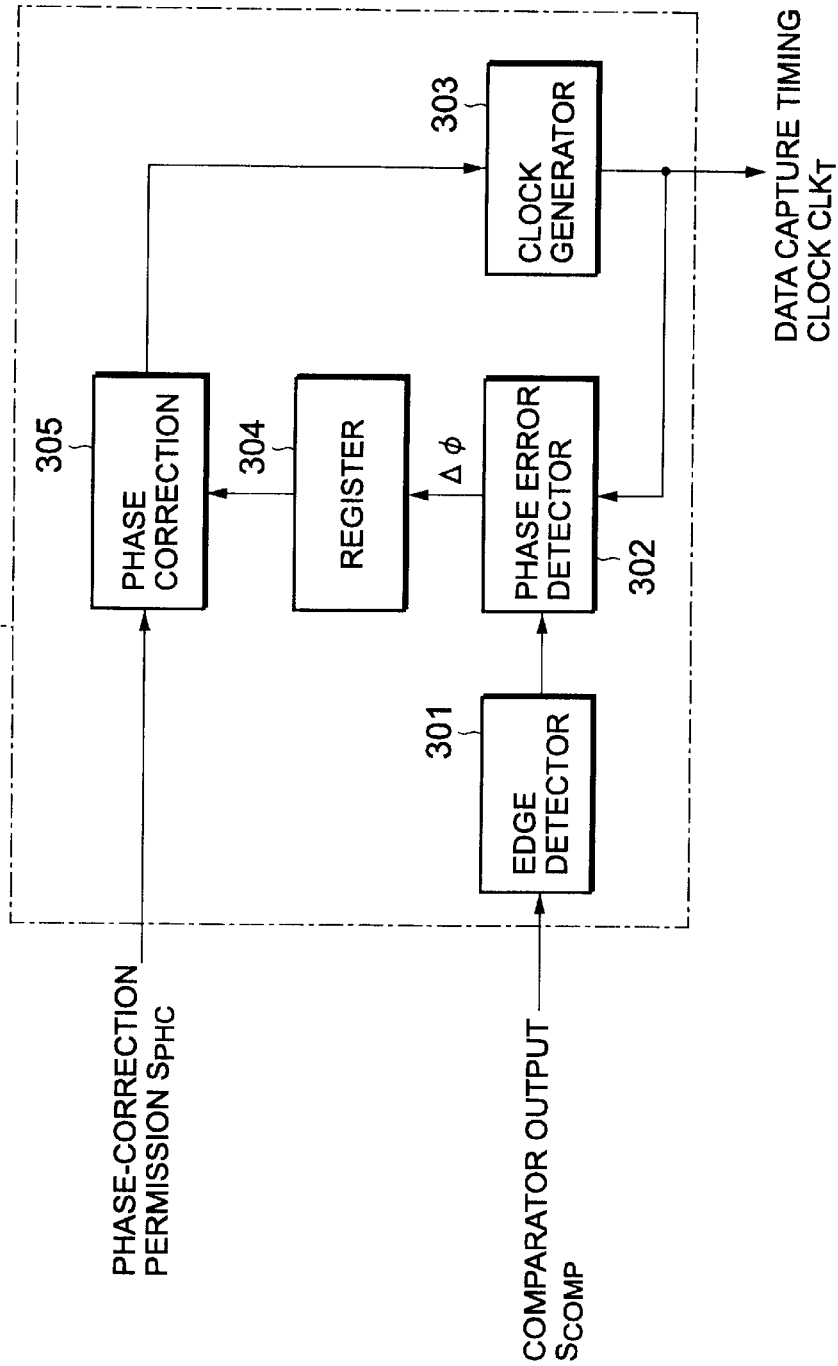
FIG. 3 Is a block diagram showing a configuration example of a phase-locked loop circuit of FIG. 1.

Referring to FIG. 3, the phase-locked loop circuit 105 includes an edge detector 301. a phase error detector 302. a clock generator 303, a register 304, and a phase correction circuit 305. The edge detector 301 detects timing of a voltage change in the comparison output $S_{COMP}$ of the comparator 5. The phase error detector 302 detects a phase error $\Delta\phi$ between an edge detected by the edge detector 301 and a clock signal generated by the clock generator 303, wherein the clock signal has the same symbol rate as the received signal.

The phase error $\Delta\phi$ detected by the phase error detector 302 is preserved in the register 304. Only when the amplitude monitor 106 generates the set flag (phase correction permission), i.e., only when the phase correction is permitted, the phase correction circuit 305 corrects the phase of the clock signal generated by the clock generator 303 by the magnitude of the phase error $\Delta\phi$ stored in the register 304.

At this time, it is conceivable to reduce the correction value which can be corrected at a time for the phase error between the output of the comparator 301 and the clock signal generated by the clock generator 303, and conduct gradual phase tracking. In this way, the ratio of error correction performed at the time when the phase error has been falsely detected can be reduced.

Typically, the output wave form of the demodulator 102 becomes like a sine waveform because of passage through the low-pass filter in the demodulation process. Since the output of the comparator 103 is obtained by comparing a 4-ary sine waveform with the middle voltage of amplitude between "00" and "10" serving as the reference, the duty ratio of the comparison signal $S_{COMP}$ changes depending on a combination of values of the received signal.

Figure 4:
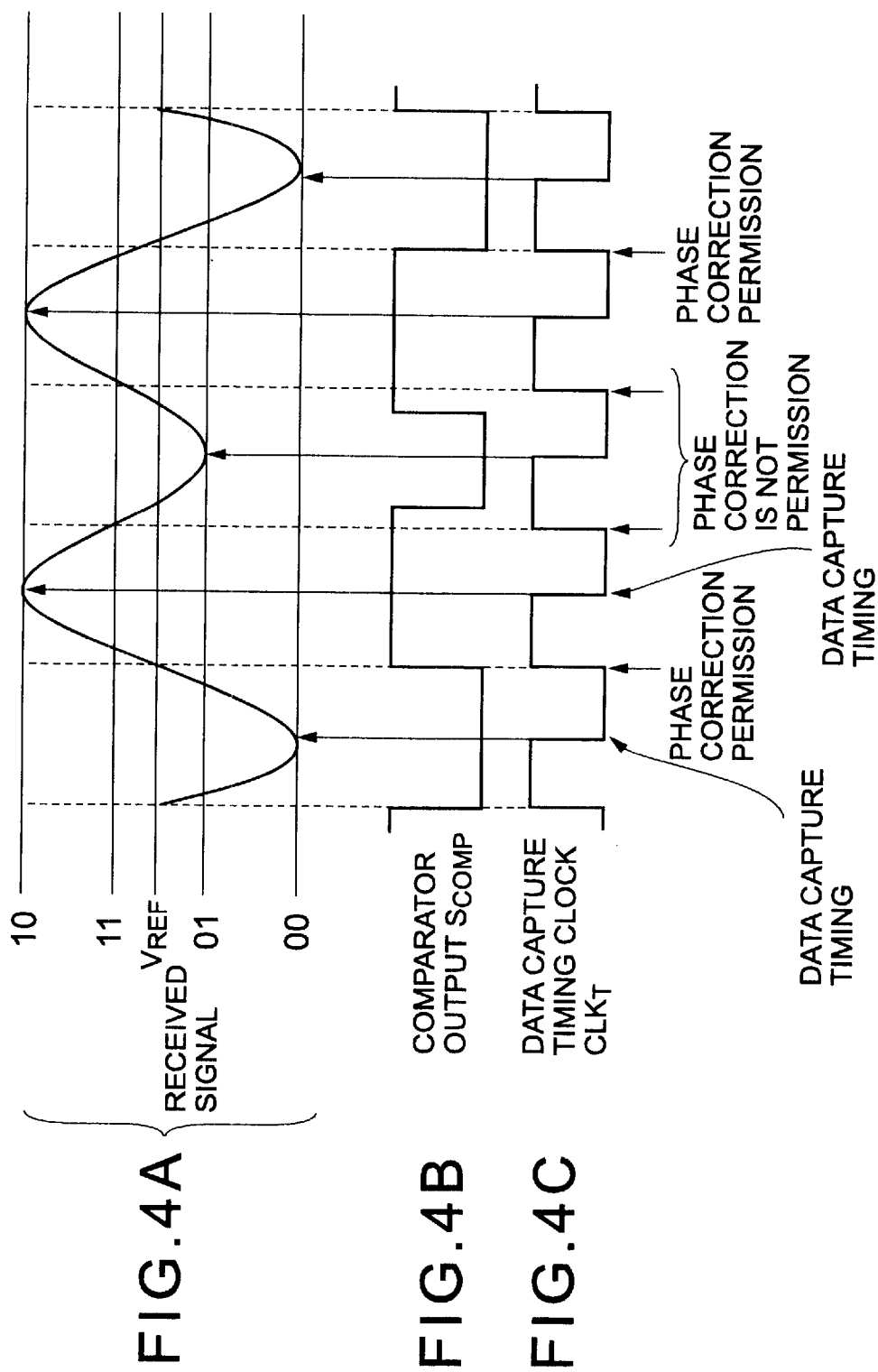
FIG. 4A is a waveform diagram showing a demodulated signal of a demodulator.
FIG. 4B is a waveform diagram showing an output of a comparator.
FIG. 4C is a waveform diagram showing data capture timing clock signal.

Referring to FIG. 4A, the demodulated waveform of the demodulator 102 becomes a 4-ary sine waveform. The reference voltage $V_{REF}$ the comparator 103 is set to the middle value of the amplitude having the level difference from "00" to "10".

The result of comparison of the demodulated waveform with the reference voltage $V_{REF}$ is the output waveform $S_{COMP}$ of the comparator 103 having a duty ratio varying depending on the demodulated waveform, as shown in FIG. 4B. The output waveform $S_{COMP}$ of the comparator 103 is used as the reference of phase-locked control between the received signal and the data capture timing clock $CLK_T$. Therefore, the change points of the comparison signal $S_{COMP}$ should coincide with those of the received signal, i.e., boundaries between signals as represented by broken lines in FIG. 4A.

As shown in FIG. 4B, however, the reference voltage $V_{REF}$ of the comparator 103 is set so as to be the middle in level between "00" and "10". When the signal has changed from "00" to "10" or from "10" to "00", therefore, the change points of the comparison signal $S_{COMP}$ with respect to the reference voltage $V_{REF}$ coincides the signal boundaries. On the other hand, when the signal has changed from "10" to "01", from "01" to "10", from "00" to "11", or "11" to "00", the change points of the comparison signal $S_{COMP}$ slips out of the signal boundaries.

Furthermore, capture of the received signal is performed at a falling edge of the data capture clock $CLK_T$. The phase-locked loop control is performed so as to reduce the phase error so that a rising edge of the data capture clock $CLK_T$ coincide with the change point of the comparison signal $S_{COMP}$ as shown in FIG. 4C. Accordingly, if the phase of the data capture clock $CLK_T$ is aligned with a position slipping out of the boundary of the received signals, it becomes impossible to capture the received data in a position where an eye pattern of the demodulated waveform is most open.

Only when the signal combination changes from "00" to "10" or from "10" to "00", the phase control is performed which makes the change point of the comparison signal $S_{COMP}$ coincide in phase with the rising edge of the data capture clock signal $CLK_T$. It is thus made possible to always capture the received signal in a position where the ,longitudlnal opening of the eye pattern of the demodulated waveform is most open.

As described above, even if the field strength of the received signal becomes weak and the vertical opening of the eye pattern is gradually closed, therefore, the probability of false decision of the received signal is reduced. As a result, the sensitivity of the receiver can be improved.

ANOTHER EMBODIMENT

Figure 5:
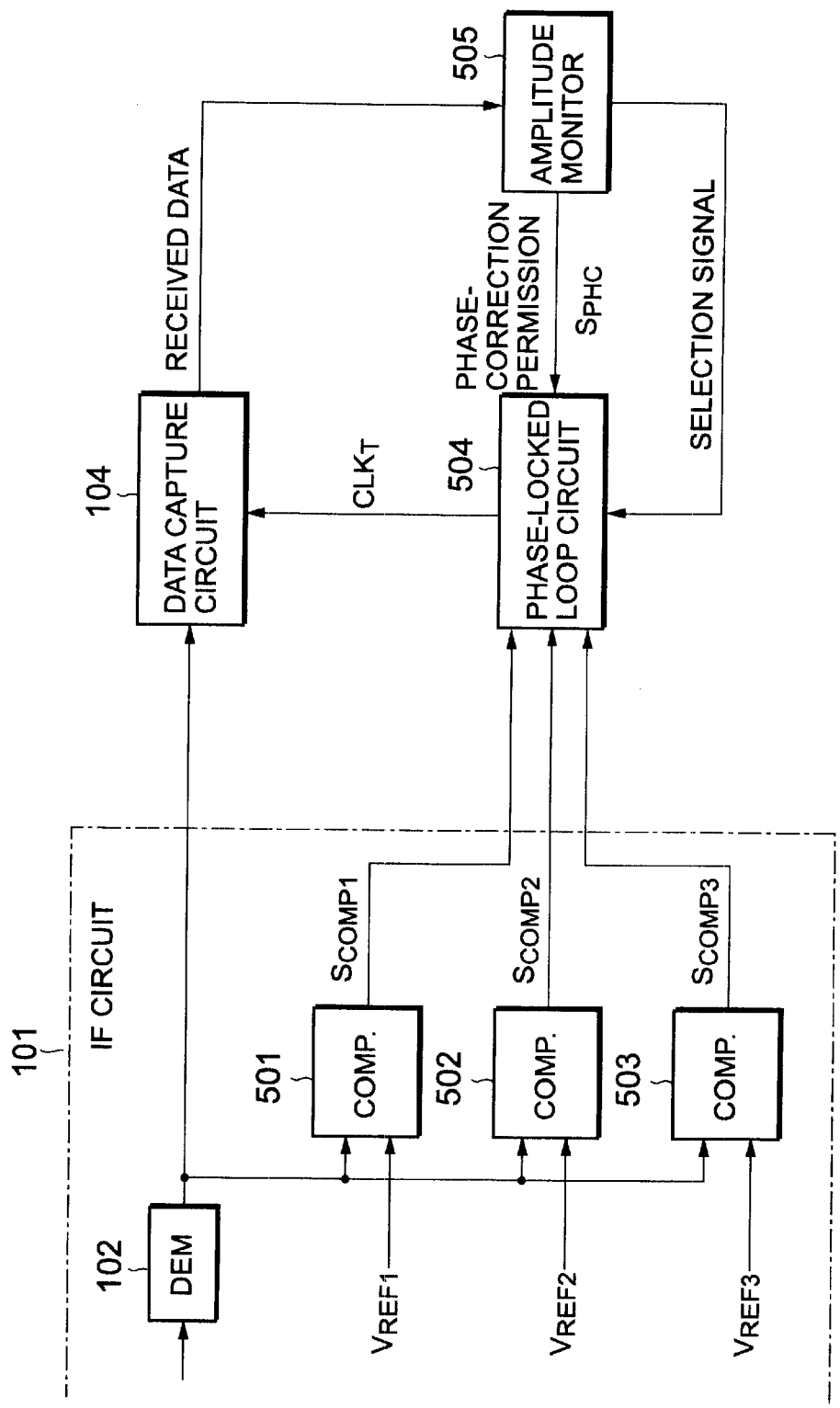
FIG. 5 is a block diagram showing the configuration of a radio selective call receiver according to a second embodiment of the present invention.

With reference to FIG. 5, a radio selective call receiver according to another embodiment has the same configuration as that as shown in FIG. 1, excepting that a first comparator 501, a second comparator 502, and a third comparator 503 are provided in the IF circuit 101. The similar circuit blocks are denoted by the same reference numerals.

The first comparator 501 is provided with a middle voltage in level between "01" and "10" as its reference voltage $V_{REF1}$. The second comparator 502 is provided with a middle voltage in level between "00" and "10" as its reference voltage $V_{REF2}$. The third comparator 503 is provided with a middle voltage in level between "00" and "11" as its reference voltage $V_{REF3}$. Therefore, the first comparator 501 compares the output of the demodulator 102 with its reference voltage $V_{REF1}$ to output a resultant comparison signal $S_{COMP1}$. The second comparator 502 compares the output of the demodulator 102 with its reference voltage $V_{REF2}$ to output a resultant comparison signal $S_{COMP2}$. The third comparator 503 compares the output of the demodulator 102 with its reference voltage $V_{REF3}$ to output a resultant comparison signal $S_{COMP3}$.

The decoder 11 is provided with a phase-locked loop circuit 504 which is composed of the clock generator 303, the phase correction circuit 305, a selector, and three circuits each consisting of an edge detector, a phase error detector, and a register (see FIG. 3). The three circuits input the comparison signals $S_{COMP1}$-$S_{COMP3}$ and store the detected phase errors onto the registers, respectively. The selector selects one of the stored phase errors depending on a selection signal inputted from an amplitude monitor 505.

The amplitude monitor 505 has the same circuit configuration as the amplitude monitor 106 as shown in FIG. 2, but a different function. More specifically, the comparator 203 has three sets of preset values. ("01" and "10"). ("00" and "10"), and ("00" and "11"). Previously stored therein. The first set of preset values ("01" and "10") corresponds to the first comparator 501. The second set of preset values ("00" and "10") representing the full swing corresponds to the second comparator 502. And the third set of preset values ("00" and "11") corresponds to the third comparator 503.

Therefore, the comparator 203 receives data from both the first register 201 and the second register 202 to determine whether a combination of the data preserved in the first register 201 and the second register 202 is ("01" and "10"), ("00" and "10") or ("00" and "11"). If a swing of the received signal matches one of them, the comparator 203 sets a phase-correction permission flag and outputs a selection signal indicating the corresponding comparator. In other words, the amplitude monitor 505 determines which one of swings occurs, ("01" and "10"), ("00" and "10") or ("00" and "11"). The selection signal is transition information of the received signal.

The phase-locked loop circuit 504 receives the transition information of the received signal from the amplitude monitor 505 and determines which of the first comparator 501. the second comparator 502, and the third comparator 503 outputs a waveform indicating the boundaries of the received signal and performs the phase control using the selected waveform.

Therefore, even in the case where the received signal varies in amplitude, for example, between "01" and "10" as shown in FIG. 4A. selecting the first comparison signal $S_{COMP1}$ allows the phase correction to be performed, resulting in more accurate phase control.

In the second embodiment of FIG. 5, the accuracy of the phase-locked loop can be further improved because of increased number of kinds of signals for use in the phase-locked loop. It is also conceivable to add another comparator associated with a signal combination other than described above, for example. ("00" and "01") or ("11" and "10"). The more the comparators in the IF circuit 101, the higher the phase control accuracy.

In this way, the received signal is captured in a position where the longitudinal opening of the eye pattern of the demodulated waveform is most open. In other words, the phase-locked loop control is performed by selecting one signal with a higher duty accuracy out of detected signals. Even if the field strength of the received signal becomes weak and the vertical opening of the eye pattern is gradually closed, therefore, the probability of a false decision of the received signal is reduced. As a result, the sensitivity of the receiver can be improved. Accordingly, it becomes possible to know the signal boundary accurately, and it becomes possible to improve the accuracy of the phase-locked control.

In accordance with the present invention, the phase-locked loop control is performed by using a signal having a higher signal duty accuracy, as heretofore described. This results in an effect that it becomes possible to detect signal boundaries accurately, and it becomes possible to improve the accuracy of the phase-locked control.

What is claimed is:

1. A radio receiver comprising:
   a detector for detecting a detected signal from a received radio signal;
   a monitor for monitoring an amplitude change of the detected signal to detect timing where the amplitude change occurs over a predetermined range;
   a clock generator for generating a timing clock signal; and
   a controller performing a phase-locked control of the timing clock signal with respect to the detected signal only when the timing is detected by the monitor,
   wherein the controller comprises:
   a comparator for comparing the detected signal to a reference level to produce a comparison signal;
   a phase error detector for detecting a phase error between the comparison signal and the timing clock signal; and
   an error adjuster for adjusting a phase of the timing clock signal so as to reduce the phase error only when the timing is detected by the monitor.

2. A radio receiver comprising:
   a detector for detecting a detected signal from a received radio signal;
   a monitor for monitoring an amplitude change of the detected signal to detect timing where the amplitude change occurs over a predetermined range;
   a clock generator for generating a timing clock signal; and
   a controller performing a phase-locked control of the timing clock signal with respect to the detected signal only when the timing is detected by the monitor,
   wherein the monitor comprises:
   a shift register for storing a previously detected signal and a currently detected signal; and
   a comparator for comparing the previously detected signal and the currently detected signal with respect to two predetermined levels corresponding to the predetermined range to produce a phase-correction permission signal when the detected signal changes in amplitude between the two predetermined levels.

3. The radio receiver according to claim 2, wherein the controller comprises:
   a comparator for comparing the detected signal to reference level to produce a comparison signal:
   a phase error detector for detecting a phase error between the comparison signal and the timing clock signal: and
   an error adjuster for adjusting a phase of the timing clock signal so as to reduce the phase error only when the phase-correction permission signal is received from the monitor.

4. A radio selective call receiver for receiving a digital-modulated signal, comprising:
   a detector for detecting a detected signal from the digital-modulated signal, the detected signal having a plurality of signal levels;
   a comparator for comparing the detected signal to a reference level to produce a comparison signal having a duty ratio;
   a selector for selecting a position of the detected signal corresponding to a comparison signal;
   a clock generator for generating a timing clock signal; and
   a controller performing a phase-locked control of the timing clock signal with the comparison signal at the position selected by the selector.

5. The radio selective call receiver according to claim 4, wherein an eye pattern of the detected signal is most open at the position selected by the selector.

6. The radio selective call receiver according to claim 4, wherein the controller comprises:
   a phase error detector for detecting a phase error between the comparison signal and the timing clock signal; and
   an error adjuster for adjusting a phase of the timing clock signal so as to reduce the phase error at the position selected by the selector.

7. The radio selective call receiver according to claim 4, wherein the selector comprises:
   a shift register for storing a previously detected signal and a currently detected signal: and
   a comparator for comparing the previously detected signal and the currently detected signal with respect to two predetermined levels corresponding to the predetermined range to select the position of the detected signal when the detected signal changes in amplitude between the two predetermined levels.

8. A phase-locked control method for a radio receiver, comprising the steps of:
   a) detecting a detected signal from a received radio signal;
   b) monitoring an amplitude change of the detected signal to detect timing where the amplitude change occurs over a predetermined range; and
   c) performing a phase-locked control of a timing clock signal with respect to the detected signal only when the timing is detected,
   wherein the step c) comprises the steps of:
      comparing the detected signal to a reference level to produce a comparison signal;
      detecting a phase error between the comparison signal and the timing clock signal; and
      adjusting a phase of the timing clock signal so as to reduce the phase error only when the timing is detected.

9. A phase-locked control method for a radio receiver, comprising the steps of:
   a) detecting a detected signal from a received radio signal;
   b) monitoring an amplitude change of the detected signal to detect timing where the amplitude change occurs over a predetermined range; and
   c) performing a phase-locked control of a timing clock signal with respect to the detected signal only when the timing is detected, wherein the step b) comprises the steps of:
      storing a previously detected signal and a currently detected signal;
      comparing the previously detected signal and the currently detected signal with respect to two predetermined levels corresponding to the predetermined range; and
      producing a phase-correction permission signal when the detected signal changes in amplitude between the two predetermined levels.

10. The method according to claim 9, wherein the step c) comprises the steps of:
    comparing the detected signal to a reference level to produce a comparison signal;
    detecting a phase error between the comparison signal and the timing clock signal; and
    adjusting a phase of the timing clock signal so as to reduce the phase error only when the phase-correction permission signal is produced.

11. A radio receiver for receiving a digital-modulated signal, comprising:
    a detector for detecting a detected signal from the digital-modulated signal, the detected signal having a plurality of signal levels;
    a comparator for comparing the detected signal to a plurality of reference levels to produce a plurality of comparison signals;
    a monitor for monitoring an amplitude change of t detected signal to detect a swing range of the detected signal and timing where the amplitude change occurs over the swing range;
    a selector for selecting one of the plurality of comparison signals depending on the swing range detected by the monitor; and
    a controller performing a phase-locked control of a timing clock signal with respect to a selected comparison signal only when the timing is detected by the monitor.

12. The radio receiver according to claim 11, wherein the phase-locked control is performed in a position of the detected signal where an eye pattern of the detected signal is most open.

13. The radio receiver according to claim 11, wherein the controller comprises:
    a phase error detector for detecting a phase error between the selected comparison signal and the timing clock signal: and
    an error adjuster for adjusting a phase of the timing clock signal so as to reduce the phase error only when the timing is detected by the monitor.

14. The radio receiver according to claim 11, wherein the monitor comprises:
    a shift register for storing a previously detected signal and a currently detected signal; and a comparator for comparing the previously detected signal and the currently detected signal with respect to a plurality of pairs of two predetermined levels corresponding to predetermined swing ranges to produce a phase-correction permission signal when the detected signal changes in amplitude between one of the pairs of the two predetermined levels.

15. The radio receiver according to claim 14, wherein the controller comprises:

a phase error detector for detecting a phase error between the selected comparison signal and the timing clock signal; and an error adjuster for adjusting a phase of the timing clock signal so as to reduce the phase error only when the phase-correction permission signal is received from the monitor.

* * * * *